United States Patent [19]

Kameyama

[11] 4,301,382
[45] Nov. 17, 1981

[54] I2L WITH PNPN INJECTOR
[75] Inventor: Syuichi Kameyama, Yokohama, Japan
[73] Assignee: Tokyo Shibaura Denki Kabushiki Kaisha, Japan
[21] Appl. No.: 142,116
[22] Filed: Apr. 21, 1980
[30] Foreign Application Priority Data Apr. 27, 1979 [JP] Japan .................. 54-51433

[51] Int. Cl.³ .............. H03K 19/091; H01L 27/04
[52] U.S. Cl. .................. 307/477; 307/296 R; 307/311; 357/30; 357/38; 357/48; 357/92
[58] Field of Search .............. 357/38, 92, 44, 46, 357/30; 307/213, 206, 299 A, 299 B, 303, 311, 296 R

[56] References Cited

U.S. PATENT DOCUMENTS

| | | | |
|---|---|---|---|
| 3,573,573 | 4/1971 | Moore | 307/299 A |
| 3,603,820 | 9/1971 | Schuenemann | 357/38 |
| 3,623,029 | 11/1971 | Davidson | 357/38 |
| 3,643,235 | 2/1972 | Berger et al. | 357/44 |
| 3,729,719 | 4/1973 | Wiedmann | 357/38 |
| 4,013,896 | 3/1977 | Picquendor et al. | 357/44 |
| 4,056,810 | 11/1977 | Hart et al. | 357/92 |
| 4,115,014 | 5/1979 | Tung | 307/299 A |
| 4,115,711 | 9/1978 | Moussie | 357/92 |
| 4,158,146 | 6/1979 | Smeulers et al. | 357/92 |
| 4,204,130 | 5/1980 | Harris | 357/44 |

Primary Examiner—William D. Larkins
Attorney, Agent, or Firm—Finnegan, Henderson, Farabow, Garrett & Dunner

[57] ABSTRACT

N- and P-type regions in the middle of a four-region PNPN device are formed in common with respective N- and P-type regions of NPN bipolar transistors. As an injection source, the four-region PNPN device performs on-off control of the NPN bipolar transistors.

6 Claims, 4 Drawing Figures

I2L WITH PNPN INJECTOR

BACKGROUND OF THE INVENTION

This invention relates to a semiconductor device, more specifically to a semiconductor device constituting a one-input multi-output logic gate.

Conventionally, TTL (transistor transistor logic) elements and IIL (integrated injection logic) elements are used to constitute logic gates. These logic gate elements, which may be formed of bipolar transistors, require much power consumption because electric current always flows through the elements irrespective of the logic state.

SUMMARY OF THE INVENTION

The object of this invention is to provide a semiconductor device which can be used as a logic gate with little power consumption.

According to this invention, there is provided a semiconductor device capable of constituting a one-input multi-output logic gate including a four-region PNPN device as an injection source combined with NPN transistors.

Further, according to this invention, there is provided a semiconductor device which can be used as a photo-sensor with high response speed in which a junction of a four-region PNPN device is irradiated to be triggered.

Furthermore, according to this invention, there is provided a semiconductor device including a four-region PNPN device capable of coexisting with an IIL element.

DETAILED DESCRIPTION OF THE PREFERRED EMBODIMENTS

Figure 1:
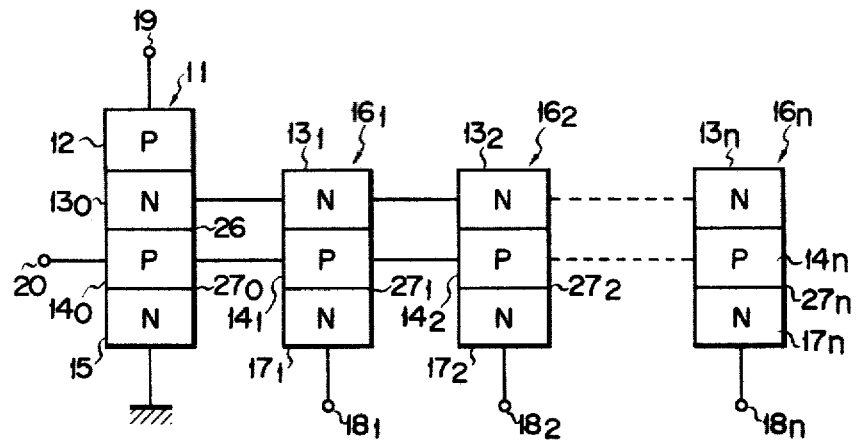
FIG. 1 is a symbol of a semiconductor device according to an embodiment of this invention.

Referring now to the drawing of FIG. 1, a four-region PNPN device 11 is formed of four regions 12, $13_0$, $14_0$ and 15. The N-type region $13_0$ of the PNPN device 11 is connected with respective N-type regions $13_1, 13_2, \ldots 13_n$ of a plurality of NPN transistors $16_1, 16_2, \ldots 16_n$, while the P-type region $14_0$ of the PNPN device 11 is connected with respective P-type regions $14_1, 14_2, \ldots 14_n$ of the NPN transistors $16_1, 16_2, \ldots 16_n$. N-type regions $17_1, 17_2, \ldots 17_n$ of the NPN transistors are connected with output terminals $18_1, 18_2, \ldots 18_n$, respectively. Further, the P-type region 12 of the four-region PNPN device 11 is connected with a power source input terminal 19, and the P-type region $14_0$ is connected with an input terminal 20.

Figure 2:
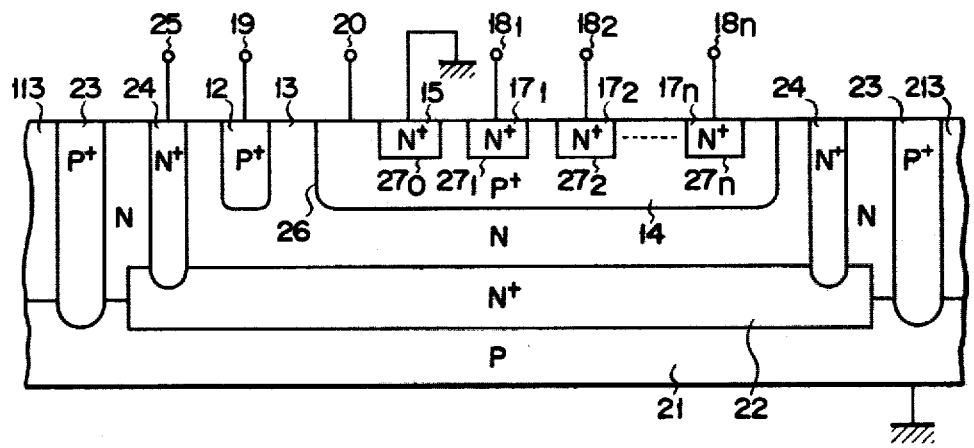
FIG. 2 is a diagram showing the structure of the semiconductor device of FIG. 1.

The semiconductor device shown in FIG. 1 is integrated as shown in FIG. 2. In FIG. 2, an N-type semiconductor layer 22 is formed on a P-type semiconductor substrate 21, and an N+-type buried region 22' is selectively disposed between the N-type semiconductor layer 22 and the P-type semiconductor substrate 21. The N-type layer 22 is separated into a plurality of N-type regions 13, 113 and 213 by a P+-type region 23. Formed in the N-type region 13 is a ring-shaped N+-type collar region 24 which reaches the N+-type buried region 22'. P+-type regions 12 and 14 are formed in the N-type region 13 inside the collar region 24. A plurality of N+-type regions 15, $17_1, 17_2, \ldots 17_n$ are formed in the P+-type region 14. The N+-type region 15 is grounded, and the N+-type regions $17_1, 17_2, \ldots 17_n$ are connected to the output terminals $18_1, 18_2, \ldots 18_n$, respectively. Further, the P+-type regions 12 and 14 are connected with the power source terminal 19 and input terminal 20, respectively.

In the semiconductor device of FIG. 2, the P+ region 12, N region 13, P+ region 14 and N+ region 15 constitute the four-region PNPN device 11, and the N region 13, P+ region 14 and N+ region $17_1$ constitute the NPN transistor $16_1$. Likewise, the N region 13, P+ region 14 and N+ region $17_2$ constitute the NPN transistor $16_2$, and the N region 13, P+ region 14 and N+ region $17_n$ constitute the NPN transistor $16_n$. Thus, according to the semiconductor device of FIG. 2, and N region $13_0$ of the four-region PNPN device 11 and the respective N regions $13_1, 13_2, \ldots 13_n$ of the NPN transistors $16_1, 16_2, \ldots 16_n$ are formed of the same N region 13. Also, the P region $14_0$ of the PNPN device 11 and the respective P regions $14_1, 14_2, \ldots 14_n$ of the NPN transistors $16_1, 16_2, \ldots 16_n$ are formed of the same P+ region 14.

The NPN transistors $16_1, 16_2, \ldots 16_n$ of the above-mentioned semiconductor device are so formed as to have the following electrical characteristics. When the transistors $16_1, 16_2, \ldots 16_n$ are operated with the N region 13 as the emitter and the N+ regions $17_1, 17_2, \ldots 17_n$ as the collector, common emitter amplification factor $\beta$-up is set for a great value, e.g. 10 or more. When the transistors $16_1, 16_2, \ldots 16_n$ are operated with the N+ regions $17_1, 17_2, \ldots 17_n$ as the emitter and the N region 13 as the collector, on the other hand, common emitter amplification factor $\beta$-down is set for hundreds to thousands. Further, the amplification factor of a transistor formed of the regions 12, $13_0$ and $14_0$ of the PNPN device 11 is set for a proper value which is neither too large nor too small in view of the logical operation performance, power consumption and other characteristics.

Now there will be described the operation of the aforementioned semiconductor device. First, in turning on the four-region PNPN device 11, a high positive pulse is supplied to the P+ region 14 through the input terminal 20 while the P+ region 12 is supplied with a constant positive voltage $V_a$ of e.g. 0.5 to 1.5 V through the power source terminal 19. At this time, a potential difference at a junction 26 of the N region 13 and P+ region 14 acts so as to change the bias of the PNPN device 11 from reverse to forward, thereby turning on the PNPN device 11. In this case, the amplification factors $\beta$-up and $\beta$-down of a transistor formed of the regions 13, 14 and 15 of the PNPN device 11 are great enough, so that the collector-emitter saturation voltage $V_{CE(sat)}$ of the transistor is several millivolts. Therefore, the potential of the N region 13, i.e. the potential at the terminal 25, is substantially equal to the ground potential. Since the potential at the input terminal 20 is substantially equal to the positive voltage Va, moreover, the junction 26 of the regions 13 and 14 is biased forwardly, and the NPN transistors $16_1, 16_2, \ldots 16_n$ are turned on.

In turning off the semiconductor device of FIG. 2, on the other hand, the input terminal 20 is opened after it is grounded. At this time, a gate current $I_g$ flowing into the input terminal 20 is 0, so that an anode current $I_a$ flowing from the power source terminal 19 is given by $I_a = I_d/(1-\alpha_1-\alpha_2)$. Here $I_d$ is an inverse leakage current at the junction 26 of the regions 13 and 14, $\alpha_1$ is the common base current amplification factor of the PNP transistor formed of the regions 12, 13 and 14, and $\alpha_2$ is the common base current amplification factor of the NPN transistor formed of the regions 13, 14 and 15. In a conventional integrated circuit, the inverse leakage current $I_d$ at the junction 26 is lower than 1 PA, so that if $\alpha_1+\alpha_2$ is smaller than 1, then the anode current $I_a$ will be lower than 1 PA to turn off the PNPN device 11. At this time, the junction $27_0$ is forwardly biased to a degree of only scores of millivolts. If $\alpha_1+\alpha_2 > 1$ is satisfied when the input terminal 20 is switched from the grounded state to the open state, the four-region PNPN device will be turned on. In the case of a PNPN device formed of a silicon semiconductor, $\alpha_1+\alpha_2 > 1$ will never hold unless the base-emitter voltage of the junction $27_0$ is 0.1 to 0.3 V. As a method for fulfilling this requirement, photocurrent is produced by emitting light in the vicinity of the junction 26 in the known manner for photothyristors, and $(\alpha_1+\alpha_2)$ is made greater than 1 by utilizing the tendency of $\alpha_1$ and $\alpha_2$ to vary with the photocurrent. In this case, therefore, the turn-on time can be shortened as the quantity of light is increased, so that the semiconductor device of this invention may be used as a photo-sensor.

Figure 3:
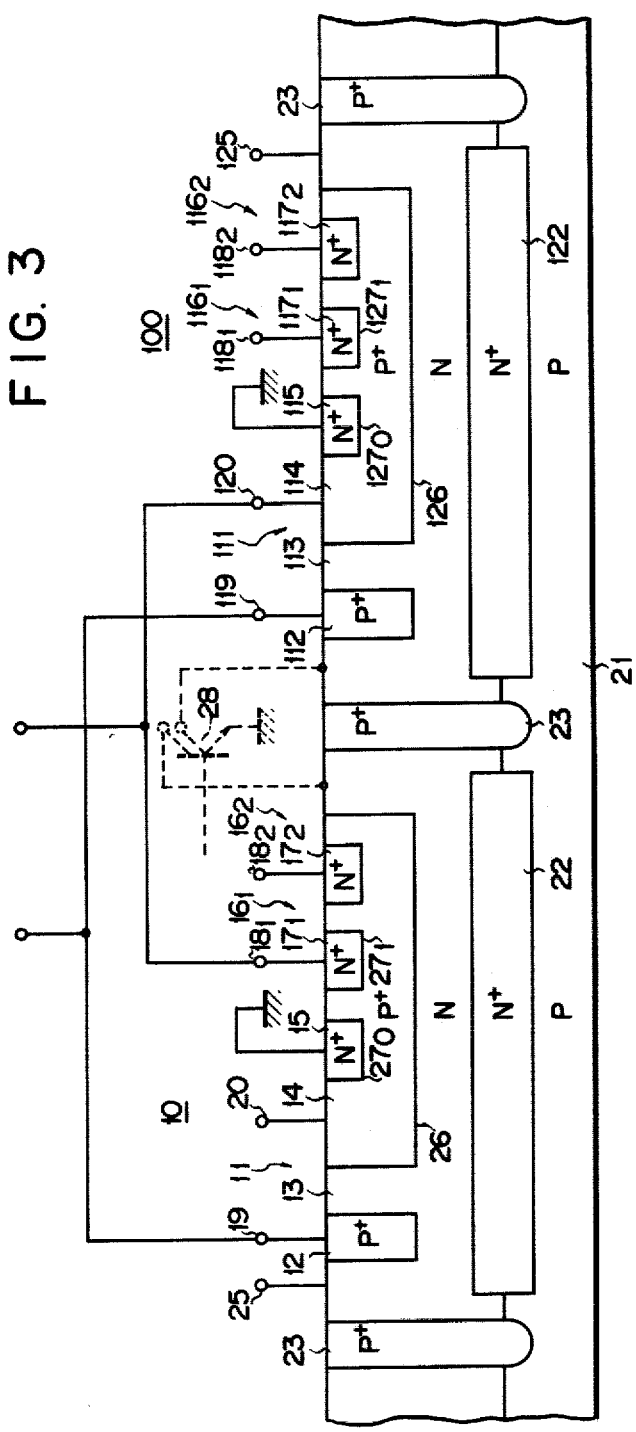
FIG. 3 is a diagram showing the structure of a semiconductor device according to another embodiment of the invention.
Figure 4:
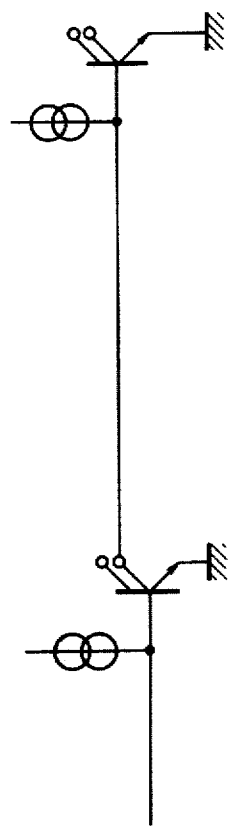
FIG. 4 is an equivalent circuit diagram of the semiconductor device shown in FIG. 3.

Referring now to FIG. 3, there will be described a semiconductor device composed of a plurality of semiconductor elements with structure similar to that of the semiconductor element of FIG. 2. In FIG. 3, first and second semiconductor elements 10 and 100 are of substantially the same structure as the element of FIG. 2 except that the collar region is omitted. That is, in the first semiconductor element 10, a P+ region 12, an N region 13, a P+ region 14, and an N+ region 15 constitute a four-region PNPN device 11, and an N+ region $17_1$, the P+ region 14, and the N region 13 constitute an NPN transistor $16_1$. Further, an N+ region $17_2$, the P+ region 14, and the N region 13 constitute another NPN transistor $16_2$. In the second semiconductor element 100, a P+ region 112, an N region 113, a P+ region 114, and an N+ region 115 constitute a four-region PNPN device 111. Also, an N+ region $117_1$, the P+ region 114, and the N region 113 constitute an NPN transistor $116_1$, while an N+ region $117_2$, the P+ region 114, and the N region 113 constitute an NPN transistor $116_2$. An output terminal $18_1$ of the first semiconductor element 10 is connected to an input terminal 120 of the second semiconductor element 100. According to the semiconductor device of FIG. 3, when the four-region PNPN device 11 of the first semiconductor element 10 is turned on, the NPN transistors $16_1$ and $16_2$ of the semiconductor element 10 are turned on. As a result, a gate current from the four-region PNPN device 111 is led into the NPN transistor $16_1$ through the input terminal 120 of the second semiconductor element 100. Thus, the second semiconductor element 100 is turned off. The gate current led out from the input terminal 120 of the second semiconductor element 100 finally becomes very low when the second semiconductor element 100 is entirely off, so that the output NPN transistor $16_1$ of the first semiconductor element 10 is saturated substantially fully. Thus, the semiconductor device of FIG. 3 constitutes a one-input multi-output two-stage inverter as shown in FIG. 4, whose logical amplitude is substantially equivalent to the source voltage $V_a$, corresponding to a variation of the input potential.

While the first semiconductor element 10 is on, potentials at a terminal 25 and output terminals $18_1$ and $18_2$ are substantially equal to the ground potential, and potential at an input terminal 20 is substantially equal to the source voltage $V_a$. Suppose the potential at the input terminal 20 is forced to be decreased in order to switch the first semiconductor element 10 from on to off; potential $V_{pg}$ at the input terminal 20 is reduced from the source voltage $V_a$ by $\Delta V_{pg}$, and at the same time potential $V_{ng}$ at the terminal 25 is increased from the ground potential by $\Delta V_{ng}$. In this case, a forward potential difference at a junction 26 is as follows:

$$(V_{pg}-V_{ng})=(V_a-\Delta V_{pg}-\Delta V_{ng}).$$

Further, a forward potential difference at a junction, $27_1$ of the NPN transistor $16_1$ is $V_{pg}=(V_a-\Delta V_{pg})$. Thus, the junction $27_1$ of the NPN transistor $16_1$ is forwardly biased to a degree $\Delta V_{ng}$ greater than the bias voltage of the junction 26. Accordingly, the junction $27_1$ functions as the emitter-base junction of an NPN transistor which utilizes a junction 26 as its collector-base junction. For this reason, a current flows out from the output terminal $18_1$ of the first semiconductor element 10 in the process of switching of the element 10 from on to off, and is supplied to the input terminal 120 of the second semiconductor element 100 to turn on the same. Suppose one end of a forward diode having a junction $127_0$ (which has substantially the same electrical characteristics with the junction $27_1$) of the second element 100 is connected to the output terminal $18_1$, and the other end of the diode is grounded. Then, if $\Delta V_{pg} \simeq \Delta V_{ng}$ is given when the first semiconductor element 10 is switched from on to off, a voltage peak corresponding to approximately $\frac{1}{3}$ of the voltage value $V_a$ appears at the output terminal $18_1$ of the first element 10. If the voltage $V_a$ is 0.6 V, for example, a voltage peak of 0.2 V is applied as a trigger voltage to the second semiconductor element 100. According to the semiconductor device of this invention, therefore, there is supposed the existence of a two-way NPN transistor in which an output NPN transistor region connected to an output terminal functions as an emitter when the semiconductor element is switched from on to off, and in which the region functions as a collector when the semiconductor element is switched from off to on.

According to this invention, as described above, a one-input multi-output inverter element is subtantially formed of transistors alone without failing to obtain a logical amplitude approximate to the source voltage $V_a$ by combining a four-region PNPN device and NPN transistors. While the semiconductor device is off, on the other hand, the power consumption is very small—as small as the leakage current at the junction. Moreover, the semiconductor device of this invention may be turned on by applying light in the vicinity of the junction of the four-region PNPN device, and may be used as a photosensor whose turn-on time can be changed by varying the intensity of light applied thereto. Also, by continually grounding the terminal 25 of the semiconductor device or the N gate region, the semiconductor device of the invention may be used as an integrated injection logic element which includes as its injector the P+ region 12 connected to the input terminal 19. Further, the semiconductor device of the invention may be used as two types of elements by selectively turning on or off a transistor 28 which is connected to the N regions 13 and 113, as represented by broken lines in FIG. 3. By grounding one of the N regions 13 and 113, the IIL element and the four-region PNPN device may easily be allowed to coexist.

If the P+ isolation region 23 of the embodiment of FIG. 2 is formed of an insulator such as oxide, furthermore, the N+ collar region 24 can be omitted to improve the packing density of the semiconductor device.

What is claimed is:

1. A one-input multi-output semiconductor device comprising:
   a first region of a first conductivity type formed on a semiconductor substrate;
   an isolation region of a second conductivity type selectively formed in said first region, whereby said first region is divided into a plurality of island regions;
   a plurality of semiconductor elements formed severally in said island regions and each composed of a four-region device and at least one bipolar transistor;
   each of said semiconductor elements including a second region of said second conductivity type formed in one of said island regions, a third region of said second conductivity type formed in said one island region at a space from said second region, a fourth region of said first conductivity type formed in said third region and connected to a reference potential, and a plurality of fifth regions of said first conductivity type formed in said third region spaced from one another and from said fourth region, and said second region, one island region, third region and fourth region constituting said four-region device, and said island region, third region and fifth regions constituting said transistor;
   means for supplying voltage between the second and fourth regions of said four-region device;
   input means connected to said third region for causing said four-region device to conduct; and
   output means connected to each of the fifth regions of said transistor, and said island region being floated.

2. A semiconductor device according to claim 1, wherein the output means of at least one of said semiconductor elements is connected to the input means of another semiconductor element.

3. A semiconductor device according to claim 1, wherein said input means is composed of means for applying radiant energy to the junction of said separated region and said third region.

4. A semiconductor device according to claim 3, wherein said means for applying radiant energy is light emitting means.

5. A semiconductor device comprising:
   a four-region device composed of a first region of a first conductivity type, a second region of a second conductivity type, a third region of said first conductivity type, and a fourth region of said second conductivity type;
   at least one transistor composed of a fifth region of said second conductivity type connected to the second region of said four-region device to function as a collector or emitter, a sixth region of said first conductivity type connected to the third region of said four-region device to function as a base, and a seventh region of said second conductivity type connected to an output terminal to function as an emitter or collector;
   means for applying voltage between the first and fourth regions of said four-region device; and
   input means causing said four-region device to conduct wherein said input means is composed of means for applying radiant energy to the junction of the second and third regions of said four-region device.

6. A semiconductor device comprising:
   a first region of a first conductivity type formed on a semiconductor substrate;
   a second region of a second conductivity type formed in said first region;
   a third region of said second conductivity type formed in said first region at a given space from said second region;
   a fourth region of said first conductivity type formed in said third region;
   at least one fifth region of said first conductivity type formed in said third region at a space from said fourth region;
   said second, first, third and fourth regions constituting a four-region device, and said first, third and fifth regions constituting at least one bipolar transistor;
   means for applying voltage between said second and fourth regions; and
   input means causing said four-region device to conduct wherein said input means is composed of means for applying radiant energy to the junction of said first and third regions.

* * * * *